(12) United States Patent
Chen et al.

(10) Patent No.: US 6,559,044 B1
(45) Date of Patent: May 6, 2003

(54) METHOD FOR FORMING CONTACTS

(75) Inventors: Chun-Che Chen, Hsinchu (TW);
Fang-Yu Yeh, Hsinchu (TW);
Han-Chih Lin, Hsinchu (TW);
Chin-Sheng Chen, Hsinchu (TW)

(73) Assignee: ProMos Technologies, Inc. (TW)

( * ) Notice: Subject to any disclaimer, the term of this patent is extended or adjusted under 35 U.S.C. 154(b) by 0 days.

(21) Appl. No.: 10/237,799

(22) Filed: Sep. 10, 2002

(51) Int. Cl.⁷ .......................................... H01L 21/4763
(52) U.S. Cl. ...................... 438/620; 438/633; 438/672
(58) Field of Search ................................ 438/620, 621, 438/630, 633, 634, 636, 637, 672, 675

(56) References Cited

U.S. PATENT DOCUMENTS

| | | | |
|---|---|---|---|
| 5,652,180 A | * 7/1997 | Shinriki et al. | 438/620 |
| 6,211,059 B1 | * 4/2001 | Inoue et al. | 438/634 |
| 6,245,656 B1 | * 6/2001 | Chen et al. | 438/620 |
| 6,258,708 B1 | * 7/2001 | Takahashi | 438/620 |
| 6,423,627 B1 | * 7/2002 | Carter et al. | 438/672 |

* cited by examiner

Primary Examiner—Chandra Chaudhari
(74) Attorney, Agent, or Firm—Finengan, Henderson, Farabow, Garrett & Dunner, L.L.P.

(57) ABSTRACT

A method for forming contacts in a semiconductor device including a plurality of active devices formed over a substrate that includes depositing a first layer of dielectric material over the substrate and plurality of active devices, forming a first opening in the first layer of dielectric material, depositing a second layer of dielectric material over the first layer of dielectric material and in the first opening, providing a mask over the second layer of dielectric material, wherein the mask material is distinguishable over silicon oxides, and forming a second opening and a third opening in the second layer of dielectric material, wherein the second opening is aligned with the first opening and exposes a first silicide of a first active device, and the third opening exposes one of diffused regions of a second active device.

23 Claims, 2 Drawing Sheets

METHOD FOR FORMING CONTACTS

DESCRIPTION

1. Field of the Invention

The invention pertains in general to a method for manufacturing a semiconductor device and, more particularly, to a method for forming contacts.

2. Background

Semiconductor manufacturing process generally includes a number of processing steps in which certain areas of a semiconductor substrate are masked while other areas are subjected to processing conditions such as etching and deposition. Efforts in the semiconductor industry have long focused on reducing the number of processing steps in a given manufacturing process while maintaining or improving upon the yield and quality of the products.

In a conventional CMOS process, a plurality of active devices, such as transistors and memory cells, are formed over the semiconductor substrate. One or more metal layers are formed over, and electrically insulated from, the active devices. Contacts, or vias, serve to electrically connect certain active regions of the active devices formed over the semiconductor substrate to one of the metal layers. For example, in a Dynamic Random Access Memory (DRAM) device, a bit line (may be a diffused region formed in the substrate) and a storage node (or gate) are electrically connected to active regions of a semiconductor substrate through self-aligned contact processes. Separate photolithographic processing steps are used to both form contact openings and expose the regions of the active devices. It is desirable to reduce the number of required processing steps associated with forming an integrated circuit. It is also desirable to improve upon current semiconductor processing techniques.

SUMMARY OF THE INVENTION

In accordance with the invention, there is provided a method for manufacturing a semiconductor device that includes providing at least two active devices over a substrate, each of the active devices includes a gate electrode provided over a gate oxide, a silicide formed over the gate electrode, a cap formed over the silicide, and a pair of spaced-apart diffused regions formed in the substrate. The method also includes depositing a first layer of dielectric material over the substrate and active devices, providing a first photoresist over the first layer of dielectric material, defining and patterning the first photoresist, etching the first layer of dielectric material unmasked by the first photoresist to form a first opening, wherein the first opening exposes a first silicide of a first active device, removing the first photoresist, depositing a second layer of dielectric material over the first layer of dielectric material and in the first opening, providing a mask over the second layer of dielectric material, providing a second photoresist over the mask, defining and patterning the second photoresist, and forming a second opening and a third opening, wherein the second opening is aligned with the first opening and exposes the first silicide of the first active device, and the third opening exposes one of the pair of the spaced-apart diffused regions of a second active device.

Also in accordance with the present invention, there is provided a method for forming contacts in a semiconductor device including a plurality of active devices over a depositing a first of dielectric devices formed over a substrate that includes depositing a first layer of dielectric material over the substrate and plurality of active devices, forming a first opening in the first layer of dielectric material, depositing a second layer of dielectric material over the first layer of dielectric material and in the first opening, providing a mask over the second layer of dielectric material, wherein the mask material is distinguishable over silicon oxides, and forming a second opening and a third opening in the second layer of dielectric material, wherein the second opening is aligned with the first opening and exposes a first silicide of a first active device, and the third opening exposes one of diffused regions of a second active device.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, an example of which is illustrated in the accompanying drawings. Wherever possible, the same reference numbers will be used throughout the drawings to refer to the same or like parts.

Figure 1A:
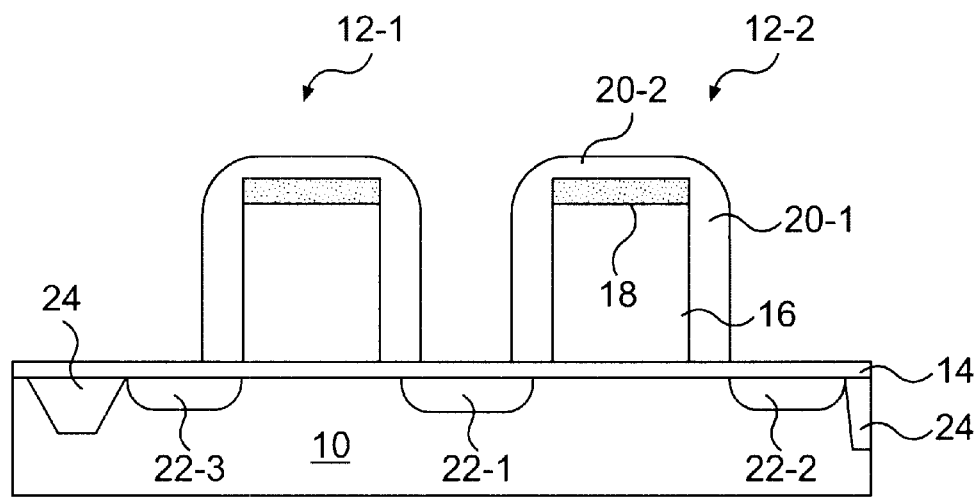
FIGS. 1A–1D are cross-sectional views of the fabrication steps consistent with one embodiment of the present invention.

FIGS. 1A–1D are cross-sectional views showing the fabrication steps consistent with one embodiment of the present invention. Referring to FIG. 1A, conventional semiconductor manufacturing steps are performed to define a substrate 10 and form active devices 12 over substrate 10. Active devices 12 shown in FIG. 1A may be transistors or memory cells, including DRAM cells. A gate oxide 14 is grown or deposited over substrate 10 and a gate electrode 16 is deposited over gate oxide 14. A silicide 18 is formed over gate electrode 16. Spacers 20-1 are formed contiguous with the vertical sidewalls of gate electrode 16 and a cap 20-2 is formed over silicide 18. In addition, each of active devices 12 includes diffused regions, which may be the source and drains regions, formed in substrate 10. Specifically, active device 12-1 includes diffused regions 22-1 and 22-3, and active device 12-2 includes diffused regions 22-1 and 22-2. Active devices 12-1 and 12-2 share diffused region 22-1, which may be one of source or drain region and a bit line. A shallow trench isolation ("STI") 24 is formed in substrate 10 to electrically isolate active devices.

Gate oxide 14 electrically insulates gate electrode 16 from substrate 10. Silicide 18 serves to provide electrical connection with a contact (not yet formed) to gate electrode 16. In an embodiment, gate electrode 16 is a polysilicon material and silicide 18 is a tungsten silicide. The spacers 20-1 and cap 20-2 may be comprised of silicon nitride such as SiON, SiN, or silicon oxide.

Figure 1B:
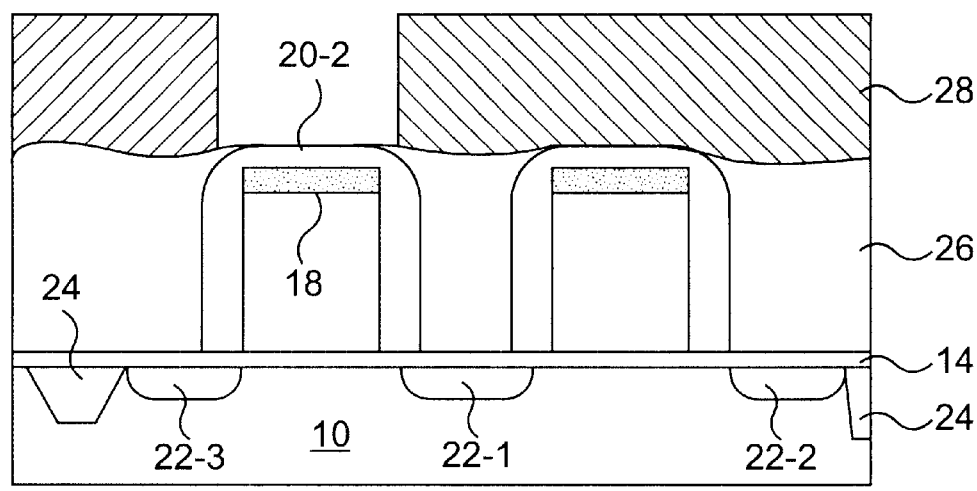

Referring to FIG. 1B, a first layer of dielectric material 26 is deposited over substrate 10 and active devices 12. In one embodiment, first layer of dielectric material 26 is an inter-layer dielectric ("ILD"), and may be comprised of boro-phospho silicate glass ("BPSG"), tetraethylorthosilicate ("TEOS"), and high-density plasma. First layer of dielectric material 26 may be planarized through chemical-mechanical polishing ("CMP"). A first photoresist 28 is provided over first layer of dielectric material 26. A first mask (not shown) with patterns of contacts is provided over first photoresist 28 to define and pattern first photoresist 28.

Figure 1C:
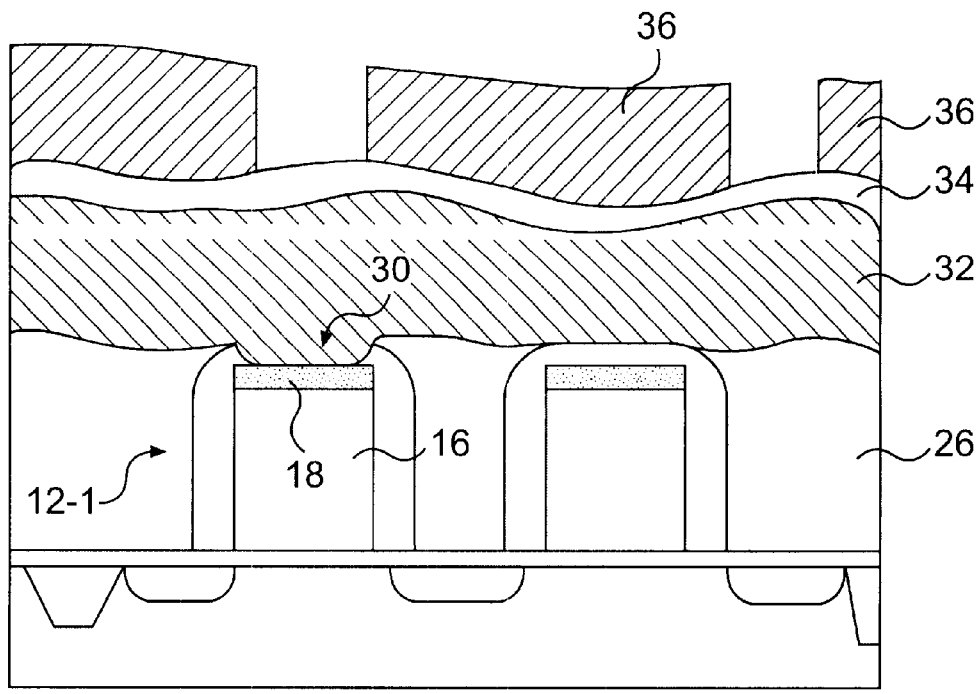

Referring to FIG. 1C, with first photoresist 28 acting as a mask, an etching step is performed to form a vertical opening 30. Either wet etch, such as using $H_3PO_4$ as an etchant, or dry etch, such as using nitrogen plasma as an etchant, may be used to form vertical opening 30. In one embodiment, the selectivity of the etchant is sufficient to remove unmasked regions of photoresist 28, first layer of dielectric material 26, and cap 20-2 to form vertical opening 30 over active device 12-1 to expose silicide 18.

In one embodiment, the etching selectivity between silicon nitrides and silicon oxides is approximately 10 to 40 in order to expose silicide 18. Vertical opening 30 extends through to silicide 18 and will become a contact connecting a metal layer (not shown) to gate electrode 16 through silicide 18. First photoresist 28 is removed, and a post-etch cleaning step may be performed.

Referring to FIG. 1C, a second layer of dielectric material 32 is deposited over first layer of dielectric material 26 and into vertical opening 30. In one embodiment, second layer of dielectric material 32 may be comprised of BPSG, TEOS, and high-density plasma. A step of rapid thermal annealing ("RTA") follows to reflow second layer of dielectric material 32 to obtain a substantially planar surface. In one embodiment, the RTA is performed at a temperature from approximately 900 to 1,000° C., preferably at a temperature from approximately 950 to 970° C.

The method of the present invention may optionally provide a layer of anti-reflection coating ("ARC"; not shown) over second layer of dielectric material 32. It is known that using an ARC layer can minimize reflective notching and critical dimension variations caused by reflection of light during photolithographic processes. The ARC material is capable of suppressing unintended light reflection from a reflective layer that is beneath a photoresist. A hardmask 34 is then provided either over the ARC layer or second layer of dielectric material 32. Hardmask 34 material should be distinguishable over silicon oxides so that subsequent etching steps may be performed. Thus, hardmask 34 may be comprised of silicon nitride, such as SiON and SiN, or polysilicon. In the embodiment in which hardmask 34 comprises silicon nitride SiON, the ARC layer will not be required because SiON may similarly minimize unintended light reflection during photolithographic processes. In addition, hardmask 34 may be deposited over second layer of dielectric material 32 through chemical-vapor deposition ("CVD").

A second photoresist 36 is provided over hardmask 34. A second mask (not shown) with patterns of contacts is provided over second photoresist 36 to define and pattern second photoresist 36. With second photoresist 36 as a mask, hardmask 34 is etched to remove a plurality of portions that correspond to areas where the contacts will eventually be formed. Second photoresist 36 is then removed.

Figure 1D:
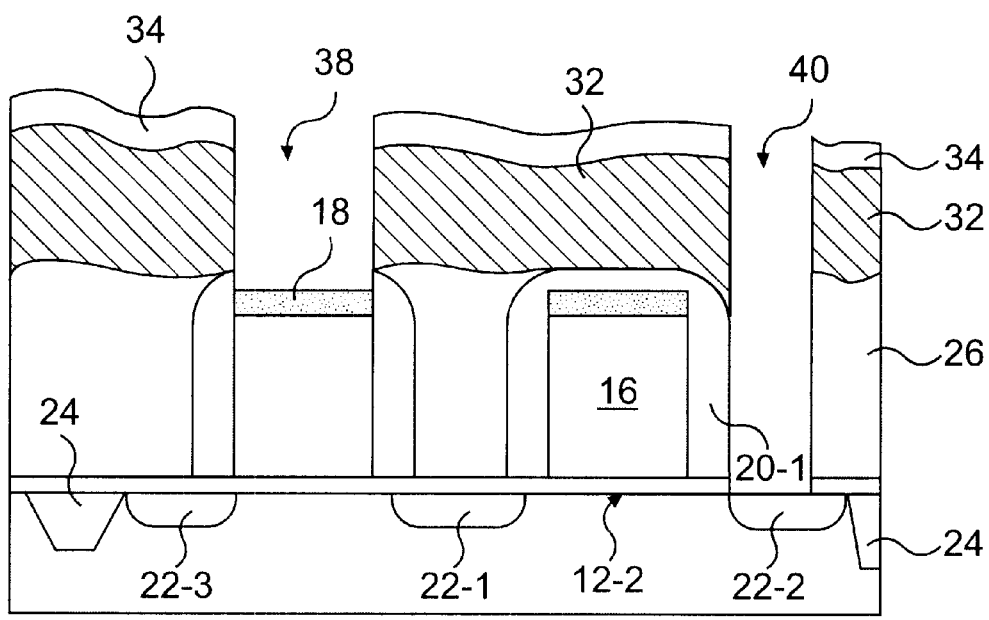

Referring to FIG. 1D, with hardmask 34 in place, an etching step is performed to form vertical openings 38 and 40. Vertical opening 38, aligned with vertical opening 30 shown in FIG. 1C, exposes silicide 18, and will later become a contact for gate electrode 16. Vertical opening 40 extends through to substrate 10, exposing diffused region 22-2, and will later become a contact for one of the source and drain regions of active device 12-2. In one embodiment, the etching step is a self-aligned contact step that forms vertical openings for gate and source/drain contacts of an active device at the same time. In addition, etchants for the etching step may be one of $C_5F_8$ or $C_4F_8$. Conventional semiconductor processes follow to fill vertical openings 38 and 40 with conductive materials to complete formation of contacts.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device, comprising:

providing at least two active devices over a substrate, each of the active devices includes a gate electrode provided over a gate oxide, a silicide formed over the gate electrode, a cap formed over the silicide, and a pair of spaced-apart diffused regions formed in the substrate;

depositing a first layer of dielectric material over the substrate and active devices;

providing a first photoresist over the first layer of dielectric material;

defining and patterning the first photoresist;

etching the first layer of dielectric material unmasked by the first photoresist to form a first opening, wherein the first opening exposes a first silicide of a first active device;

removing the first photoresist;

depositing a second layer of dielectric material over the first layer of dielectric material and in the first opening;

providing a mask over the second layer of dielectric material;

providing a second photoresist over the mask;

defining and patterning the second photoresist; and forming a second opening and a third opening, wherein the second opening is aligned with the first opening and exposes the first silicide of the first active device, and the third opening exposes one of the pair of the spaced-apart diffused regions of a second active device.

2. The method as claimed in claim 1, wherein the two active devices share one of the pair of the spaced-apart diffused regions.

3. The method as claimed in claim 1, wherein the first layer of dielectric material may be comprised of boro-phospho silicate glass, tetraethylorthosilicate, or high-density plasma.

4. The method as claimed in claim 1, further comprising a step of planarizing the first layer of dielectric material through chemical-mechanical polishing.

5. The method as claimed in claim 1, wherein the etching step for forming a first opening comprises wet etch.

6. The method as claimed in claim 1, wherein the etching step for forming a first opening comprises dry etch.

7. The method as claimed in claim 1, wherein the etching step for forming a first opening comprises an etching selectivity between silicon nitrides and silicon oxides of approximately 10 to 40.

8. The method as claimed in claim 1, wherein the second layer of dielectric material may be comprised of boro-phospho silicate glass, tetraethylorthosilicate, or high-density plasma.

9. The method as claimed in claim 1, further comprising rapid thermal annealing to reflow the second layer of dielectric material to obtain a substantially planar surface.

10. The method as claimed in claim 9, wherein the rapid thermal annealing is performed at a temperature from approximately 900 to 1,000° C.

11. The method as claimed in claim 10, wherein the rapid thermal annealing is performed at a temperature from approximately 950 to 970° C.

12. The method as claimed in claim 1, further comprising providing a layer of anti-reflection coating over the second layer of dielectric material.

13. The method as claimed in claim 1, wherein the mask material is distinguishable over silicon oxides.

14. The method as claimed in claim 13, wherein the mask may be comprised of silicon nitride or polysilicon.

15. The method as claimed in claim 1, wherein the step of forming the second and third openings comprises a self-aligned contact step.

16. A method for forming contacts in a semiconductor device including a plurality of active devices formed over a substrate, comprising:
    depositing a first layer of dielectric material over the substrate and plurality of active devices;
    forming a first opening in the first layer of dielectric material;
    depositing a second layer of dielectric material over the first layer of dielectric material and in the first opening;
    providing a mask over the second layer of dielectric material, wherein the mask material is distinguishable over silicon oxides; and
    forming a second opening and a third opening in the second layer of dielectric material, wherein the second opening is aligned with the first opening and exposes a first silicide of a first active device, and the third opening exposes one of diffused regions of a second active device.

17. The method as claimed in claim 16, wherein the first layer of dielectric material may be comprised of boro-phospho silicate glass, tetraethylorthosilicate, or high-density plasma.

18. The method as claimed in claim 16, further comprising a step of planarizing the first layer of dielectric material through chemical-mechanical polishing.

19. The method as claimed in claim 16, wherein the step for forming a first opening comprises an etching step having a selectivity between silicon nitrides and silicon oxides of approximately 10 to 40.

20. The method as claimed in claim 16, wherein the second layer of dielectric material may be comprised of boro-phospho silicate glass, tetraethylorthosilicate, or high-density plasma.

21. The method as claimed in claim 16, further comprising rapid thermal annealing to reflow the second layer of dielectric material to obtain a substantially planar surface.

22. The method as claimed in claim 16, further comprising providing a layer of anti-reflection coating over the second layer of dielectric material.

23. The method as claimed in claim 16, wherein the step of forming the second and third openings comprises a self-aligned contact step.

* * * * *